(12) United States Patent
Groos et al.

(10) Patent No.: US 8,224,620 B2
(45) Date of Patent: Jul. 17, 2012

(54) METHOD FOR CHECKING THE DRIFTABILITY OF METALLIC TUBES

(75) Inventors: Andreas Groos, Rheurdt (DE); Stefan Nitsche, Mülheim (DE)

(73) Assignee: V&M Deutschland GmbH, Düsseldorf (DE)

( * ) Notice: Subject to any disclaimer, the term of this patent is extended or adjusted under 35 U.S.C. 154(b) by 0 days.

(21) Appl. No.: 13/132,448

(22) PCT Filed: Nov. 27, 2009

(86) PCT No.: PCT/DE2009/001708
§ 371 (c)(1), (2), (4) Date: Jun. 2, 2011

(87) PCT Pub. No.: WO2010/063277
PCT Pub. Date: Jun. 10, 2010

(65) Prior Publication Data
US 2011/0238369 A1    Sep. 29, 2011

(30) Foreign Application Priority Data
Dec. 3, 2008    (DE) .......................... 10 2008 060 391

(51) Int. Cl.
*G01B 21/10*    (2006.01)
(52) U.S. Cl. ....................................................... 702/157
(58) Field of Classification Search ................... 702/157
See application file for complete search history.

(56) References Cited

U.S. PATENT DOCUMENTS
4,354,379 A    10/1982    Miner

FOREIGN PATENT DOCUMENTS
GB    2 064 121 A    6/1981

OTHER PUBLICATIONS

What can VisonArray™ 3-D Virtual Imaging technology do for you?, Technical Industries, printed Dec. 5, 2011, p. 1-9.*

* cited by examiner

*Primary Examiner* — Tung S Lau
(74) *Attorney, Agent, or Firm* — Henry M. Feiereisen; Ursula B. Day

(57) ABSTRACT

The invention relates to a method for testing the driftability of metal tubes, wherein a cylindrical drift body having a defined diameter and a defined length is guided through the tube with defined force for ensuring a predetermined internal diameter and a minimum straightness. Virtual drifting is hereby performed instead of the physical drift operation.

2 Claims, No Drawings

METHOD FOR CHECKING THE DRIFTABILITY OF METALLIC TUBES

CROSS-REFERENCES TO RELATED APPLICATIONS

This application is the U.S. National Stage of International Application No. PCT/DE2009/001708, filed Nov. 27, 2009, which designated the United States and has been published as International Publication No. WO 2010/063277 and which claims the priority of German Patent Application, Serial No. 10 2008 060 391.0, filed Dec. 3, 2008, pursuant to 35 U.S.C. 119(a)-(d).

BACKGROUND OF THE INVENTION

The invention relates to a method for checking the driftability of metallic tubes.

In various customer specifications/regulations a so-called "drifting" is required before tubes are delivered, wherein a cylindrical body with a defined length is guided through the tube. The test of body is hereby pulled, pushed or shot through the tube. This test is important, for example, for drill pipes used in oil exploration, because a drill head having a defined diameter must be guided to the drilling site.

Drifting of pipes ensures that a predetermined inside diameter in combination with a minimum straightness is maintained.

If the drift body gets stuck in the pipe, then a decision has to be made if reworking, e.g., by grinding, should be performed, or if the pipe can be assigned to another job or if the pipe may even have to be scrapped.

These drift tests are, on one hand, very costly and time-consuming and have, on the other hand, the disadvantage that they must be performed outside the typical pipe production flow.

The test results are therefore available only at a later time in the production process so that any required changes in the manufacturing parameters can only be performed very late. This causes increased scrap or more rework, or both.

Moreover, drift bodies may disadvantageously get stuck in the pipe during drift tests, necessitating a shutdown of the test facility and hence costly downtime.

SUMMARY OF THE INVENTION

It is therefore an object of the invention to provide a method which, on one hand, satisfies the customer-specific requirements relating to drifting and, on the other hand, also eliminates the aforementioned disadvantages.

According to the invention, this object is attained by a method for testing the driftability of metallic tubes, wherein a cylindrical drift body with a defined diameter, a defined length and with a defined force is moved through the tube for ensuring a predetermined inside diameter and a minimum straightness, wherein instead of the physical drift operation, virtual drifting is performed, wherein a complete geometry of the tube is described in form of a three-dimensional image by using previously determined measurement data for the outside diameter and the wall thickness along the circumference and along the entire length of the tube as well as measurement data or assumed values for the straightness at precise locations, and subsequently a virtual drift body having a predetermined length and a predetermined diameter is virtually pushed through the tube in a mathematical simulation, whereby the driftability of the tube is determined by comparing geometric values of the tube and the drift body at identical locations. Advantageous embodiments are recited in the dependent claims.

The method according to the invention is characterized in that instead of the physical drift operation a virtual drift operation is performed, wherein the geometry of the pipe is completely represented in form of a three-dimensional image by using previously determined measurement data obtained at a precise location for the outside diameter and the wall thickness along the circumference and the entire length of the pipe as well as measurement data or assumed values for the straightness, and wherein subsequently in a mathematical simulation a virtual cylindrical drift body with a predetermined length and a predetermined diameter is virtually pushed through the pipe, whereby information about the driftability of the pipe can be deduced through a comparison of geometric values of the pipe and the drift body obtained at the same location.

The core idea of the method according to the invention is therefore that instead of a physical drift test on a real pipe, a virtual driftabilty test is performed by using measurement data from the complete geometric description of the same pipe.

This approach drastically reduces the costs for the driftability test, because the test is performed only virtually. Moreover, the results of the tests are quickly available so that the production parameters can be changed in real time, thus significantly reducing reworking of pipes and pipe failure, respectively, potentially saving significant additional costs.

Advantageously, already existing measurement data from the nondestructive testing of the tubes to be drifted is used for carrying out the method, wherein the wall thicknesses and the diameters and optionally the center position, i.e., the straightness, were determined, with their coordinates allowing an accurate correlation between the longitudinal position on the pipe and its circumference at the respective locations.

According to the invention, a geometric description of the pipe, i.e. an image in three-dimensional form, is generated from these measurement values.

A virtual cylindrical drift body having a predetermined length and a predetermined diameter is then guided through this image of the pipe by using a mathematical simulation, and the driftability is evaluated.

This can be performed, for example, by evaluating the interior geometry of the pipe in the form of slices. The driftability of the pipe can be evaluated slice-by-slice by selecting the possible spatial displacement of the disk center along the predetermined drift length and placing therethrough a least-square straight line.

The method according to the invention can still be carried out even if measurement data about the center positions characterizing the straightness are not available for the pipe. However, the conclusion will be somewhat less accurate, because in this case the guaranteed value, including tolerances, according to the customer specifications is assumed for the straightness.

In an advantageous modification of the invention, different diameters and/or lengths of the drift body can be tested by iterating the aforedescribed process. This question repeatedly arises in the manufacturing process, if for example the customer requirements change accordingly.

The method of the invention can advantageously be used to determine the location at which the drift mandrel would get stuck. This information enables a targeted repair, e.g., by trimming or internal grinding.

BRIEF DESCRIPTION OF THE DRAWING

NONE

DETAILED DESCRIPTION OF PREFERRED EMBODIMENTS

NONE

The advantages of the invention can be summarized as follows:

Reduction of the manufacturing-related complexity during the test,

Elimination of automatic drift systems operated with compressed air,

Decrease of the downtimes due to drift mandrels stuck in the pipe,

Fast results regarding the maximum drift length and/or the maximum drift diameter and hence rapid decision support for the operation, if the pipes must be reworked or can be used for another order, Determining the position where the drift mandrel would get stuck enables targeted reworking.

The invention claimed is:

1. A method for testing driftability of metallic tubes, wherein in a physical drift operation a cylindrical drift body with a defined diameter, a defined length is moved with a defined force through a tube for ensuring a predetermined inside diameter and a minimum straightness, comprising the steps of:

measuring an outside diameter and a wall thickness along a circumference and along an entire length of a metallic tube, and measuring a straightness of the tube at predetermined locations of the tube, for completely describing a geometry of the tube in form of a three-dimensional image, determining from the measured outside diameter and wall thickness and the measured straightness an interior tube geometry along the entire length of the tube, representing the interior tube geometry along the entire length of the tube in a coordinate system, defining a physical cylindrical drift body having a predetermined length and a predetermined diameter for unobstructed movement through the metallic tube, modeling the physical cylindrical drift body with a virtual drift body having exterior dimensions commensurate with the predetermined length and the predetermined diameter of the physical cylindrical drift body, moving the virtual drift body through the interior tube geometry represented in the coordinate system, comparing the interior tube geometry and the exterior dimensions of the virtual drift body at identical locations along the entire length of the tube, verifying driftability of the physical cylindrical drift body through the tube based on unobstructed movement of the virtual drift body through the interior tube geometry, and modifying the interior tube geometry through trimming or internal grinding the tube at locations where movement of the virtual drift body through the interior tube geometry is obstructed.

2. The method of claim 1, wherein the driftability of the tube is determined by iteration for different diameters and lengths of the drift body.

* * * * *